US012300492B2

(12) United States Patent
Wang et al.

(10) Patent No.: US 12,300,492 B2
(45) Date of Patent: May 13, 2025

(54) METHOD FOR MANUFACTURING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventors: Mengmeng Wang, Hefei (CN); Hsin-Pin Huang, Hefei (CN); Qiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 520 days.

(21) Appl. No.: 17/650,241

(22) Filed: Feb. 7, 2022

(65) Prior Publication Data
US 2022/0310392 A1 Sep. 29, 2022

Related U.S. Application Data

(63) Continuation of application No. PCT/CN2021/112319, filed on Aug. 12, 2021.

(30) Foreign Application Priority Data

Mar. 26, 2021 (CN) .......................... 202110323591.6

(51) Int. Cl.
H01L 21/033 (2006.01)
H01L 21/027 (2006.01)
(Continued)

(52) U.S. Cl.
CPC ...... *H01L 21/0337* (2013.01); *H01L 21/0273* (2013.01); *H01L 21/3086* (2013.01); *H01L 21/76802* (2013.01)

(58) Field of Classification Search
CPC ............ H01L 21/0337; H01L 21/0273; H01L 21/3086; H01L 21/76802
See application file for complete search history.

(56) References Cited

U.S. PATENT DOCUMENTS 5,776,826 A 7/1998 Mitwalsky
6,753,608 B2 6/2004 Tomita
(Continued)

FOREIGN PATENT DOCUMENTS

CN 1476072 A 2/2004
CN 1738008 A 2/2006
(Continued)

OTHER PUBLICATIONS

First Office Action of the Chinese application No. 202110323591.6, issued on Apr. 22, 2022.
(Continued)

*Primary Examiner* — Peniel M Gumedzoe
(74) *Attorney, Agent, or Firm* — Syncoda LLC; Feng Ma

(57) ABSTRACT

A method for manufacturing a semiconductor structure includes: providing a substrate, a bottom protecting wall being formed in the substrate; forming a mask layer on the substrate; forming a groove in the mask layer, a non-zero angle existing between a sidewall of the groove and a sidewall of the bottom protecting wall, and the bottom of the groove extending into the substrate; and forming a top protecting wall in the groove, the top protecting wall being in direct contact with the bottom protecting wall.

11 Claims, 9 Drawing Sheets

(51) Int. Cl.
*H01L 21/308* (2006.01)
*H01L 21/768* (2006.01)

(56) References Cited

U.S. PATENT DOCUMENTS

| | | | |
|---|---|---|---|
| 9,123,730 B2 | 9/2015 | Kuo et al. | |
| 2004/0026785 A1 | 2/2004 | Tomita | |
| 2008/0099884 A1 | 5/2008 | Masahio | |
| 2010/0219533 A1* | 9/2010 | Ootake | H01L 21/76834 |
| | | | 257/773 |
| 2010/0295188 A1* | 11/2010 | Han | H01L 21/76885 |
| | | | 257/E21.585 |
| 2011/0068466 A1 | 3/2011 | Chen | |
| 2015/0014828 A1 | 1/2015 | Kuo et al. | |
| 2015/0171025 A1 | 6/2015 | Shao et al. | |
| 2016/0315045 A1* | 10/2016 | Baek | H01L 21/76843 |
| 2018/0315707 A1 | 11/2018 | Fox, III et al. | |
| 2020/0176359 A1 | 6/2020 | Chen et al. | |

FOREIGN PATENT DOCUMENTS

| | | |
|---|---|---|
| CN | 101770992 A | 7/2010 |
| CN | 102024781 A | 4/2011 |
| CN | 105870069 A | 8/2016 |
| CN | 108788486 A | 11/2018 |
| CN | 111480226 A | 7/2020 |
| CN | 111564411 A | 8/2020 |
| CN | 111900131 A | 11/2020 |
| CN | 113078109 A | 7/2021 |
| CN | 113078140 A | 7/2021 |
| JP | 2005203476 A | 7/2005 |
| JP | 2006005011 A | 1/2006 |
| JP | 2008112825 A | 5/2008 |
| KR | 20140008552 A | 1/2014 |
| KR | 20180121737 A | 11/2018 |

OTHER PUBLICATIONS

First Office Action of the Chinese application No. 202110323584.6, issued on Dec. 3, 2021.
Notice of Allowance of the Chinese application No. 202110323551.1, issued on Feb. 23, 2022.

* cited by examiner

METHOD FOR MANUFACTURING SEMICONDUCTOR STRUCTURE, AND SEMICONDUCTOR STRUCTURE

CROSS-REFERENCE TO RELATED APPLICATIONS

This is a continuation of International Application No. PCT/CN2021/112319 filed on Aug. 12, 2021, which claims priority to Chinese Patent Application No. 202110323591.6 filed on Mar. 26, 2021. The disclosures of the above-referenced applications are hereby incorporated by reference in their entirety.

BACKGROUND

In the process of manufacturing a wafer, a protective structure needs to be configured at a peripheral region of a chip, so as to prevent the wafer damage of an interior of a chip during cutting a wafer.

SUMMARY

The disclosure relates to the technical field of semiconductor manufacturing processes, and specifically to a method for manufacturing a semiconductor structure, and a semiconductor structure.

One aspect of the embodiments of the disclosure provides a method for manufacturing a semiconductor structure. The method includes following operations. A substrate is provided. A bottom metal layer is formed in the substrate. A mask layer is formed on the substrate. A groove is formed in the mask layer. A non-zero angle exists between a sidewall of the groove and a sidewall of the bottom metal layer. The bottom of the groove extends into the substrate. A top metal layer is formed in the groove. The top metal layer is in direct contact with the bottom metal layer.

Another aspect of the embodiments of the disclosure provides a semiconductor structure, The semiconductor structure includes: a substrate, and a bottom metal layer located in the substrate; a groove located in a mask layer on the substrate, the bottom of the groove extending into the substrate, and a non-zero angle existing between a sidewall of the groove and a sidewall of the bottom metal layer; and a top metal layer located in the groove, the top metal layer being in direct contact with the bottom metal layer.

DETAILED DESCRIPTION

Figure 1:
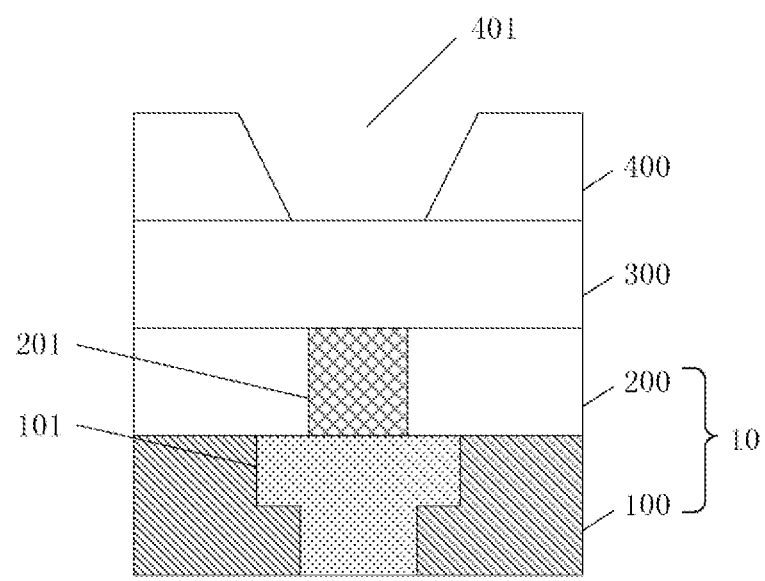
FIG. 1 is a first schematic diagram of a semiconductor structure under several steps of a method for manufacturing the semiconductor structure according to an exemplary embodiment.

Exemplary embodiments are now described more comprehensively with reference to the drawings. However, the exemplary embodiments can be implemented in various forms and should not be understood to be limited to embodiments elaborated herein. On the contrary, these embodiments are provided to make the disclosure comprehensive and complete and make the concept of the exemplary embodiments delivered to persons skilled in the art comprehensively. The same reference numerals in the accompanying drawings represent the same or similar structures, and thus the detailed description thereof is omitted.

A protective effect of a protective structure needs to be improved.

As shown in FIGS. 1 to 9, in the embodiment, a method for manufacturing a semiconductor structure provided by the disclosure at least includes the following operations.

A substrate 10 is provided. A bottom metal layer 201 is formed in the substrate 10.

A mask layer 300 is formed on the substrate 10.

A groove 301 is formed in the mask layer 300. A non-zero angle 20 exists between a sidewall of the groove 301 and a sidewall of the bottom metal layer 201. The bottom of the groove 301 extends into the substrate 10.

A top metal layer 500 is formed in the groove 301. The top metal layer 500 is in direct contact with the bottom metal layer 201.

By forming the top metal layer having an inclined sidewall, the method for manufacturing the semiconductor structure provided by the disclosure can reduce, damage of a crack on the top metal layer during chip cutting, and improve a protective effect of the top metal layer.

As shown in FIG. 1, the substrate 10 includes a first dielectric layer 100 and a second dielectric layer 200. The bottom metal layer 201 is located in the second dielectric layer 200. The first dielectric layer 100 and the second dielectric layer 200 may be made of common semiconductor dielectric materials such as silicon oxide and silicon nitride. Barrier layers may be formed on a sidewall and a bottom surface of the bottom metal layer 201, and a top surface of the bottom metal layer 201 is exposed at a surface of the substrate 10. The material of the bottom metal layer 201 include metals, for example, but not limited tungsten or copper. The material of the barrier layers include but are not limited to TiN (titanium nitride), TaN (tantalum nitride), or Ta (tantalum), etc. The bottom metal layer 201 may be configured around a chip to protect the chip from being damaged due to the crack or a stress during wafer cutting.

Optionally, a base metal layer 101 is further formed at the substrate. The base metal layer 101 is located in the first dielectric layer 100. The material of the base metal layer 101 includes metals, for example, but not limited tungsten or copper. The bottom metal layer 201 is located above the base metal layer 101 and is in direct contact with the base metal layer 101. By configuring the bottom metal layer 201 and the base metal layer 101, comprehensive protection can be provided for the chip.

In the embodiment, the mask layer 300 is formed on the substrate 10. Specifically, the mask layer 300 may be formed on the substrate 10 by means of a deposition process, such as physical vapor deposition (PVD) or chemical vapor deposition (CVD). The mask layer 300 also covers the bottom metal layer 201. The material of the mask layer 300 may be silicon nitride, silicon oxide, or a low-K material, etc. The material of the mask layer 300 and the material of the substrate 10 may be the same or not.

Figure 2:
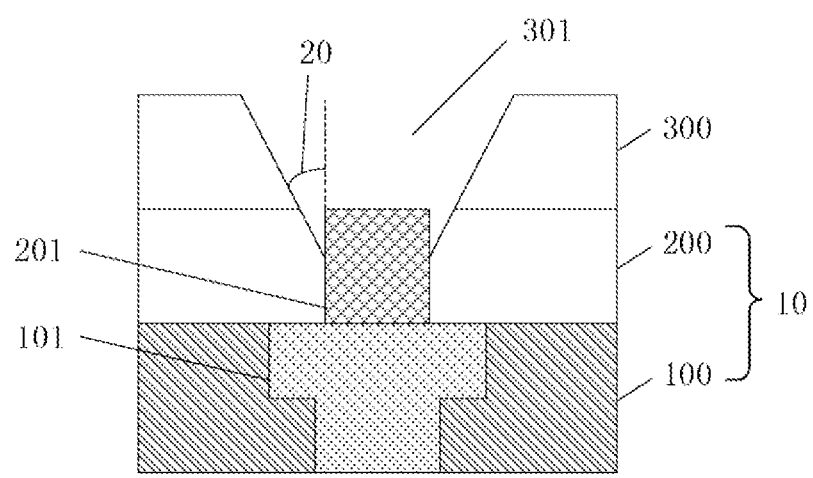
FIG. 2 is a second schematic diagram of a semiconductor structure under several steps of a method for manufacturing the semiconductor structure according to an exemplary embodiment.

The groove 301 is formed in the mask layer 300. The non-zero angle 20 exists between the sidewall of the groove 301 and the sidewall of the bottom metal layer 201. The bottom of the groove 301 extends into the substrate 10. Specifically, as shown in FIG. 2, the groove 301 at least exposes part of a side surface of the bottom metal layer 201. The groove 301 may be formed close to the bottom metal layer 201. When the barrier layers are formed on the sidewall and the bottom surface of the bottom metal layer 201, the groove 301 may also expose part of the barrier layer on the sidewall of the bottom metal layer 201. Specifically, the angle 20 may be an acute angle. For example, the angle 20 ranges from 10 to 45 degrees such as 15 degrees, 20 degrees, 25 degrees, 30 degrees, 35 degrees, and 40 degrees. If the angle 20 is too small, the impact of the crack or the stress received by a subsequently formed top metal layer 500 cannot be reduced. If the angle 20 is too large, the crack or the stress withstood by the top metal layer 500 would be guided to the substrate 10 or the mask layer 300, resulting in that the substrate 10 or the mask layer 300 is separated from the top metal layer 500. Specifically, an impact force withstood by the top metal layer 500 may be decomposed into a first sub force in a direction perpendicular to a sidewall of the top metal layer 500 and a second sub force along a sidewall direction of the top metal layer 500. When the angle 20 is too small, the first sub force in the direction perpendicular to the sidewall of the top metal layer 500 cannot be effectively reduced; and when the angle 20 is too large, the second sub force along the sidewall direction of the top metal layer 500 would be greatly enhanced, resulting in that the substrate 10 or the mask layer 300 is separated from the top metal layer 500.

Figure 3:
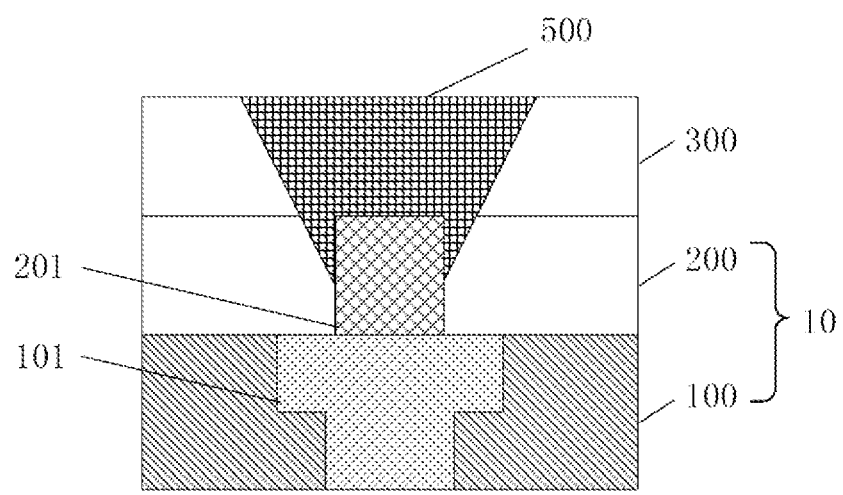
FIG. 3 is a third schematic diagram of a semiconductor structure under several steps of a method for manufacturing the semiconductor structure according to an exemplary embodiment.

As shown in FIG. 3, the top metal layer 500 is formed in the groove 301. The top metal layer 500 is in direct contact with the bottom metal layer 201 so as to reach better protection for the chip. The material of the top metal layer 500 includes metals, for example, but not limited tungsten or copper. Specifically, copper may be formed by means of electroplating, and tungsten may be formed by means of CVD or PVD.

Optionally, the sidewall and the bottom of the top metal layer 500 further include barrier layers. The material of the barrier layers include but are not limited to TiN, TaN, or Ta, etc.

In one example, the operation that the groove 301 is formed in the mask layer 300 includes following sub-operations. A photoresist layer 400 is formed on the mask layer 300. An opening pattern 401 is formed on the photoresist layer 400. The opening pattern 401 has an inclined sidewall. The mask layer 300 and the substrate 10 are etched by using the opening pattern 401.

Optionally, as shown in FIG. 1, for the operation that the opening pattern 401 is formed on the photoresist layer 400 includes following sub-operations. The photoresist layer 400 is exposed by means of positive defocusing and is developed to form the opening pattern 401. An angle between the sidewall of the opening pattern 401 and a bottom surface of the opening pattern 401 is greater than 90 degrees.

Figure 4:
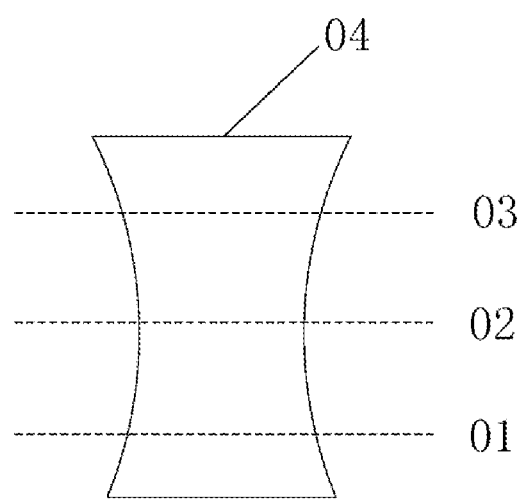
FIG. 4 is a light intensity distribution diagram near a focus point during exposure.

FIG. 4 is a light intensity distribution diagram near a focus point during exposure. 04 is a light intensity distribution diagram; 02 is a focus point position; 03 is a positive defocusing position; and 01 is a negative defocusing position. Specifically, when a photoresist is a positive photoresist, and the positive defocusing position 03 is set as the focal length of exposure of the photoresist layer 400, the opening pattern 401 shown in FIG. 1 may be obtained after developing. The angle between the sidewall of the opening pattern 401 and the bottom surface of the opening pattern 401 is greater than 90 degrees. An upper opening size of the opening pattern 401 is greater than a bottom opening size of the opening pattern 401.

Figure 5:
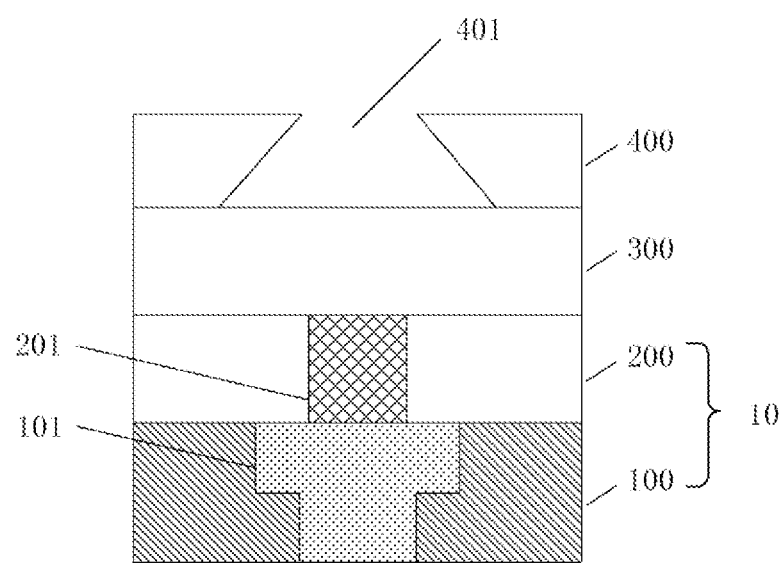
FIG. 5 is a first schematic diagram of a semiconductor structure under several steps of a method for manufacturing the semiconductor structure according to another exemplary embodiment.

Optionally, as shown in FIG. 5, the operation that the opening pattern 401 is formed on the photoresist layer 400 includes following sub-operations. The photoresist layer 400 is exposed by means of negative defocusing and is developed to form the opening pattern 401. The angle between the sidewall of the opening pattern 401 and the bottom surface of the opening pattern 401 is less than 90 degrees.

FIG. 4 is a light intensity distribution diagram near a focus point during exposure. 04 is the light intensity distribution diagram; 02 is the focus point position; 03 is the positive defocusing position; and 01 is the negative defocusing position. Specifically, when the photoresist is the positive photoresist, and the negative defocusing position 01 is set as the focal length of exposure of the photoresist layer 400, the opening pattern 401 shown in FIG. 5 may be obtained after developing. The angle between the sidewall of the opening pattern 401 and the bottom surface of the opening pattern 401 is less than 90 degrees. The upper opening size of the opening pattern 401 is less than the bottom opening size of the opening pattern 401.

Specifically, the opening pattern 401 may be obtained by performing defocusing exposure on the photoresist layer having a certain thickness. A defocusing distance of the positive defocusing or the negative defocusing is 20% to 50% of the thickness of the photoresist layer 400. The defocusing distance of positive defocusing may be understood as a vertical distance between 03 and 02; and the defocusing distance of negative defocusing may be understood as a vertical distance between 01 and 02. Specifically, the defocusing distance of positive defocusing or negative defocusing may be 100 to 500 nm; and the thickness of the photoresist layer 400 may be 200 to 2,500 nm. The opening pattern having a good topography can be obtained within the aforementioned range of defocusing distance and the range of thickness, so that the opening pattern has good linear inclined sidewall. That is, the sidewall of the opening pattern is in the shape of a straight line and is inclined. The opening pattern 401 having the inclined sidewall is formed by means of positive defocusing or negative defocusing, thereby being capable of simplifying the process steps, and reducing a cost.

The mask layer 300 and the substrate 10 are etched by using the opening pattern 401, so as to form the groove 301 in the mask layer 300. Specifically, the mask layer 300 is etched by a dry etching process by taking the photoresist layer 400 as a mask. The inclined sidewall of the opening pattern 401 may be synchronously conveyed into the mask layer 300, so that the groove 301 formed in the mask layer 300 has an inclined sidewall. As shown in FIGS. 1 and 2, the opening pattern 401 is located just above the bottom metal layer 201. That is, a projection center of the opening pattern 401 coincides with a projection center of the bottom metal layer 201 on the surface of the substrate 10. The upper opening size of the opening pattern 401 is greater than the bottom opening size of the opening pattern 401. The mask layer 300 and the substrate 10 are etched by using the opening pattern 401, so as to form the groove 301. The upper opening size of the groove 301 is greater than the lower opening size of the groove 301. The bottom of the groove 301 extends into the substrate 10. Specifically, the bottom of the groove 301 may expose part of the top surface and the side surface of the bottom metal layer 201, so that the subsequently formed top metal layer may be well embedded into the bottom metal layer, so as to enhance protection strength.

Optionally, a projection of the opening pattern 401 at least partially coincides with a projection of the bottom metal layer 201 on the surface of the substrate 10.

Optionally, the materials of the substrate 10 and the mask layer 300 are the same, and they both are, for example, silicon oxide or silicon nitride. Thus, a formation process of the groove 301 can be simplified.

Figure 6:
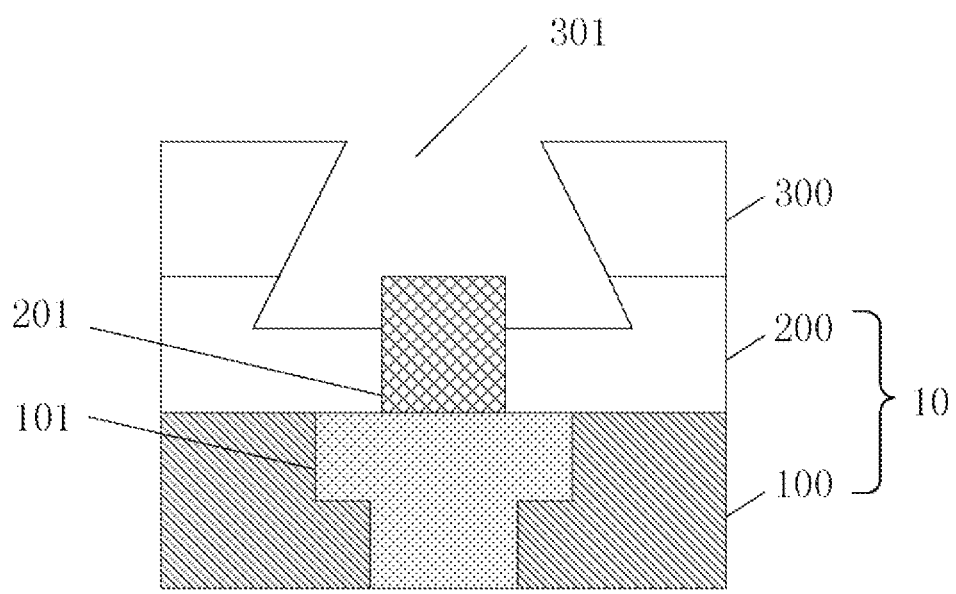
FIG. 6 is a second schematic diagram of a semiconductor structure under several steps of a method for manufacturing the semiconductor structure according to another exemplary embodiment.

Exemplarily, as shown in FIGS. 5 and 6, the opening pattern 401 is located just above the bottom metal layer 201. That is, the projection center of the opening pattern 401 coincides with the projection center of the bottom metal layer 201 on the surface of the substrate 10. In other examples, the projection of the opening pattern 401 at least partially coincides with the projection of the bottom metal layer 201 on the surface of the substrate 10. The upper opening size of the opening pattern 401 is less than the bottom opening size of the opening pattern 401. The mask layer 300 and the substrate 10 are etched by using the opening pattern 401, so as to form the groove 301. The upper opening size of the groove 301 is less than the lower opening size of the groove 301. The bottom of the groove 301 extends into the substrate 10. Specifically, the bottom of the groove 301 may expose part of the top surface and the side surface of the bottom metal layer 201. The materials of the substrate 10 and the mask layer 300 are the same, and they both are, for example, silicon oxide or silicon nitride. Thus, the formation process of the groove 301 can be simplified.

Figure 7:
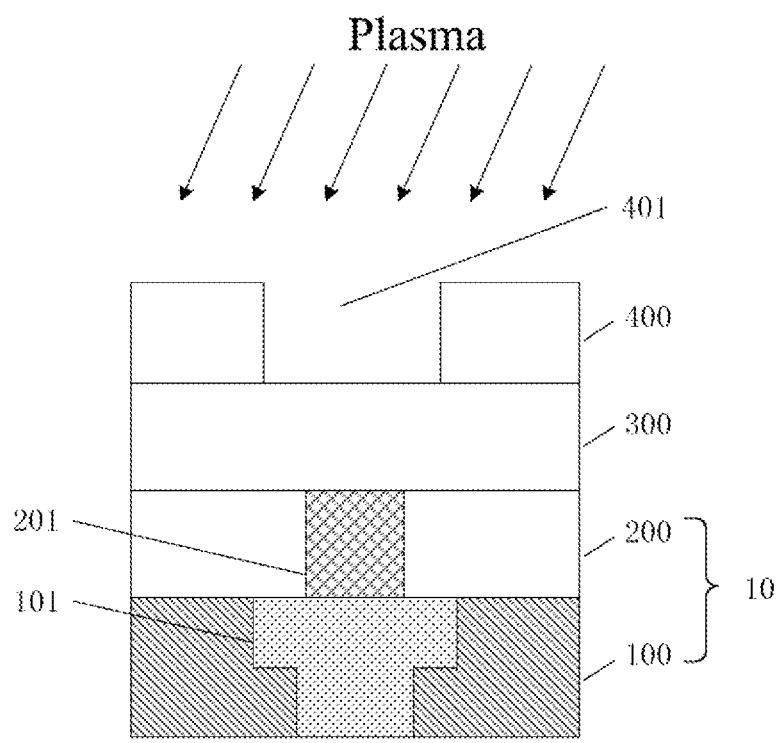
FIG. 7 is a first schematic diagram of a semiconductor structure under several steps of a method for manufacturing the semiconductor structure according to another exemplary embodiment.
Figure 8:
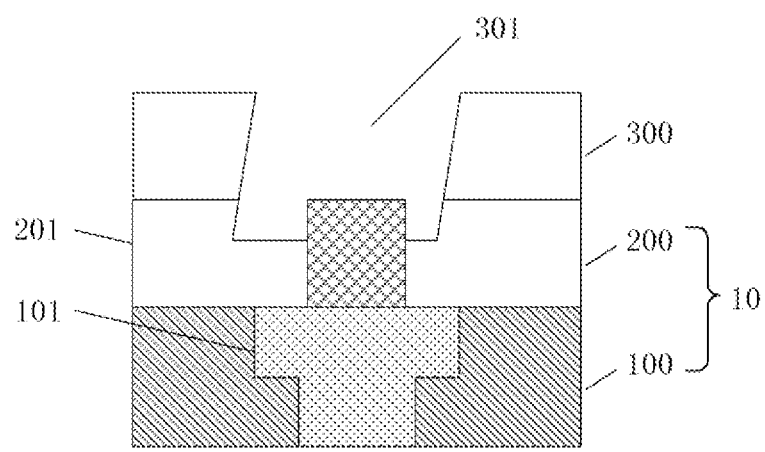
FIG. 8 is a second schematic diagram of a semiconductor structure under several steps of a method for manufacturing the semiconductor structure according to another exemplary embodiment.

In another example, as shown in FIGS. 7 and 8, the operation that the groove 301 is formed in the mask layer 300 includes following sub-operations. The photoresist layer 400 is formed on the mask layer. The opening pattern 401 is formed on the photoresist layer 400. The mask layer 300 and the substrate 10 are obliquely dry-etched with plasma. Specifically, as shown in FIGS. 7 and 8, the mask layer 300 is dry-etched with plasma. An angle between an incident direction of the plasma and a direction along the sidewall of the bottom metal layer 201 may range from 10 to 45 degrees, so that the groove 301 having the inclined sidewall is formed in the mask layer 300 and the substrate 10. Specifically, the sidewall of the bottom metal layer 201 is perpendicular to a direction along the surface of the substrate 10; and the sidewall of the groove 301 is not perpendicular to the direction along the surface of the substrate 10.

Figure 9:
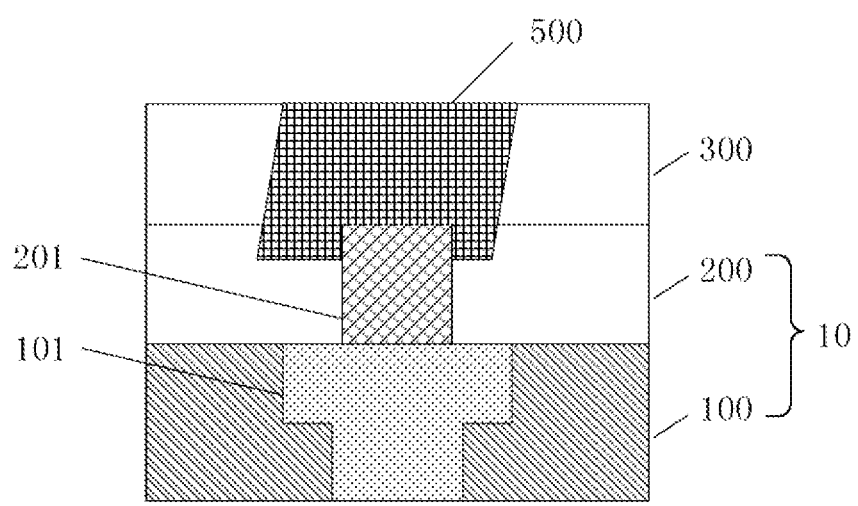
FIG. 9 is a third schematic diagram of a semiconductor structure under several steps of a method for manufacturing the semiconductor structure according to another exemplary embodiment.

The top metal layer 500 is formed in the groove 301. The top metal layer 500 is in direct contact with the bottom metal layer 201. Specifically, as shown in FIG. 3, the width of the upper part of the top metal layer 500 is greater than the width of the lower part of the top metal layer 500. The bottom of the top metal layer 500 caps the top of the bottom metal layer 201. In another example, the width of the upper part of the top metal layer 500 is less than the width of the lower part of the top metal layer 500. The bottom of the top metal layer 500 caps the top of the bottom metal layer 201. In other examples, as shown in FIG. 9, the width of the upper part of the top metal layer 500 is equal to the width of the lower part of the top metal layer 500. The bottom of the top metal layer 500 caps the top of the bottom metal layer 201.

Optionally, the projection center of the top metal layer 500 and the projection center of the bottom metal layer 201 on the surface of the substrate 10 do not coincide. As shown in FIG. 9, a width of part of the top metal layer 500 at a left side of the bottom metal layer 201 is greater than a width of part of the top metal layer 500 at a right side of the bottom metal layer 201. The projection center of the top metal layer 500 on the surface of the substrate 10 is located at the left side of the projection center of the bottom metal layer 201 on the surface of the substrate 10.

Another embodiment of the disclosure further provides a semiconductor structure. FIGS. 3 and 9 are schematic diagrams of a semiconductor structure provided by the embodiment. The semiconductor structure includes a substrate 10 and a bottom metal layer 201 located in the substrate 10, a groove 301 and a top metal layer 500.

The groove 301 is located in a mask layer 300 on the substrate 10. The bottom of the groove 301 extends into the substrate 10.

A non-zero angle exists between the sidewall of the groove 301 and the sidewall of the bottom metal layer 201.

The top metal layer 500 located in the groove 301. The top metal layer 500 is in direct contact with the bottom metal layer 201.

In one embodiment, the angle is an acute angle.

In one embodiment, the angle ranges from 10 to 45 degrees.

In one embodiment, the width of the upper part of the top metal layer 500 is greater than the width of the lower part of the top metal layer 500.

In one embodiment, the width of the upper part of the top metal layer 500 is less than the width of the lower part of the top metal layer 500.

In one embodiment, the width of the upper part of the top metal layer 500 is equal to the width of the lower part of the top metal layer 500.

In one embodiment, the projection center of the top metal layer and the projection center of the bottom metal layer on the surface of the substrate do not coincide.

In one embodiment, the material of the bottom metal layer 201 and the top metal layer 500 is copper or tungsten.

The semiconductor structure provided by the disclosure, by means of the inclined sidewall on the top metal layer, can reduce the damage of the crack on the top metal layer during chip cutting, and improve the protective effect of the top metal layer.

Although the disclosure is already described with reference to several typical embodiments, it should be understood that the used terms are illustrative and exemplary, rather than limitative. Since the disclosure can be specifically implemented in various forms without departing from the spirit or essence of the disclosure, it should be understood that the aforementioned embodiments are not limited to any details above, and should be explained widely within the spirit and scope defined in the appended claims. Hence, all variations and modifications falling within the claims or equivalent scopes thereof should be covered by the appended claims.

What is claimed is:

1. A method for manufacturing a semiconductor structure, comprising:
   providing a substrate, a bottom metal layer being formed in the substrate;
   forming a mask layer on the substrate;
   forming a groove in the mask layer, a sidewall of the groove and a sidewall of the bottom metal layer being neither parallel nor coincident, and a bottom of the groove extending into the substrate; and
   forming a top metal layer in the groove, the top metal layer being in direct contact with the bottom metal layer;
   wherein a width of an upper part of the groove is not greater than a width of a lower part of the groove.

2. The method for manufacturing a semiconductor structure of claim 1, wherein said forming a groove in the mask layer comprises:
   forming a photoresist layer on the mask layer;
   forming an opening pattern on the photoresist layer, the opening pattern having an inclined sidewall; and
   etching the mask layer and the substrate by using the opening pattern.

3. The method for manufacturing a semiconductor structure of claim 2, wherein said forming an opening pattern on the photoresist layer comprises:
   exposing the photoresist layer by means of negative defocusing and developing to form the opening pattern,
   wherein an angle between a sidewall of the opening pattern and a bottom surface of the opening pattern is less than 90 degrees.

4. The method for manufacturing a semiconductor structure of claim 3,
   wherein a defocusing distance of the negative defocusing is 20% to 50% of a thickness of the photoresist layer.

5. The method for manufacturing a semiconductor structure of claim 1, wherein said forming a groove in the mask layer comprises:
   forming a photoresist layer on the mask layer;
   forming an opening pattern on the photoresist layer; and
   obliquely dry-etching the mask layer and the substrate with plasma.

6. The method for manufacturing a semiconductor structure of claim 1, wherein a non-zero angle exists between an extended plane of the sidewall of the groove and an extended plane of the sidewall of the bottom metal layer, the non-zero angle is an acute angle.

7. The method for manufacturing a semiconductor structure of claim 6, wherein the non-zero angle ranges from 10 to 45 degrees.

8. A semiconductor structure, comprising:
   a substrate and a bottom metal layer located in the substrate;
   a groove located in a mask layer on the substrate, a bottom of the groove extending into the substrate, wherein a sidewall of the groove and a sidewall of the bottom metal layer are neither parallel nor coincident; and
   a top metal layer located in the groove, the top metal layer being in direct contact with the bottom metal layer;
   wherein a width of an upper part of the groove is not greater than a width of a lower part of the groove.

9. The semiconductor structure of claim 8, wherein a non-zero angle exists between an extended plane of the sidewall of the groove and an extended plane of the sidewall of the bottom metal layer, and the non-zero angle is an acute angle.

10. The semiconductor structure of claim 9, wherein the non-zero angle ranges from 10 to 45 degrees.

11. The semiconductor structure of claim 8, wherein a projection center of the top metal layer and a projection center of the bottom metal layer on a surface of the substrate do not coincide.

* * * * *